(12) United States Patent
Mase et al.

(10) Patent No.: US 12,324,260 B2
(45) Date of Patent: Jun. 3, 2025

(54) MULTIPLYING IMAGE SENSOR

(71) Applicant: HAMAMATSU PHOTONICS K.K., Hamamatsu (JP)

(72) Inventors: Mitsuhito Mase, Hamamatsu (JP); Jun Hiramitsu, Hamamatsu (JP); Hiroaki Ishii, Hamamatsu (JP); Yuma Tanaka, Hamamatsu (JP); Toshinori Ito, Hamamatsu (JP)

(73) Assignee: HAMAMATSU PHOTONICS K.K., Hamamatsu (JP)

( * ) Notice: Subject to any disclaimer, the term of this patent is extended or adjusted under 35 U.S.C. 154(b) by 438 days.

(21) Appl. No.: 17/787,981

(22) PCT Filed: Nov. 11, 2020

(86) PCT No.: PCT/JP2020/042061
§ 371 (c)(1),
(2) Date: Jun. 22, 2022

(87) PCT Pub. No.: WO2021/131372
PCT Pub. Date: Jul. 1, 2021

(65) Prior Publication Data
US 2023/0022384 A1    Jan. 26, 2023

(30) Foreign Application Priority Data
Dec. 27, 2019    (JP) .................................. 2019-239493

(51) Int. Cl.
*H10F 39/00*    (2025.01)

(52) U.S. Cl.
CPC ....... *H10F 39/8033* (2025.01); *H10F 39/807* (2025.01); *H10F 39/811* (2025.01)

(58) Field of Classification Search
None
See application file for complete search history.

(56) References Cited

U.S. PATENT DOCUMENTS

2014/0374867 A1    12/2014    De Munck et al.

FOREIGN PATENT DOCUMENTS

| CN | 101484999 | 7/2009 |
| CN | 109643722 A | 4/2019 |

(Continued)

OTHER PUBLICATIONS

International Preliminary Report on Patentability mailed Jul. 7, 2022 for PCT/JP2020/042061.

(Continued)

*Primary Examiner* — Daniel Whalen
(74) *Attorney, Agent, or Firm* — Faegre Drinker Biddle & Reath LLP

(57) ABSTRACT

A multiplying image sensor includes a semiconductor layer having a first surface and a second surface and a wiring layer provided on the second surface. The semiconductor layer includes a plurality of pixels arranged along the first surface. Each of the plurality of pixels includes a first semiconductor region, a second semiconductor region formed on the second surface side with respect to at least a part of the first semiconductor region and divided for each of the plurality of pixels, and a well region formed in the second semiconductor region so as to be separated from the first semiconductor region and forming a part of a pixel circuit. At least a part of the first semiconductor region and at least a part of the second semiconductor region form an avalanche multiplication region.

8 Claims, 12 Drawing Sheets

(56) References Cited

FOREIGN PATENT DOCUMENTS

| CN | 110447104 A | 11/2019 |
| JP | 2004-128296 A | 4/2004 |
| JP | 2007-165868 A | 6/2007 |
| JP | 2018-157156 A | 10/2018 |
| JP | 2019169643 A * | 10/2019 |
| WO | WO-2017/043068 A1 | 3/2017 |
| WO | WO-2019/186750 A1 | 10/2019 |

OTHER PUBLICATIONS

Yang Guangwen, "Optical Control Phased Array Radar Optical Emission Technology Hardware Circuit Design and External Modulation System Research", China Excellent Master's Thesis Full-text Database (Information Technology Edition), Nov. 30, 2005, p. 1-p. 67.

R.Berger, "Megapixel CMOS image sensor fabricated in three-dimensional integrated circuit technology", ISSCC, Aug. 29, 2005.

* cited by examiner

MULTIPLYING IMAGE SENSOR

TECHNICAL FIELD

The present disclosure relates to a multiplying image sensor.

BACKGROUND ART

As a multiplying image sensor, Patent Literature 1 describes a solid-state imaging device including a semiconductor layer in which an avalanche multiplication region is formed. In the example of the solid-state imaging device described in Patent Literature 1, each of a plurality of pixels provided in the semiconductor layer includes a p-type semiconductor region, an n-type semiconductor region that is formed in the p-type semiconductor region and forms an avalanche multiplication region together with a part of the p-type semiconductor region, and a p-type well region that is formed in a p⁻-type semiconductor region of the p-type semiconductor region and forms a part of a pixel circuit. The n-type semiconductor region is divided for each of the plurality of pixels.

CITATION LIST

Patent Literature

Patent Literature 1: International Publication WO 2017/043068

SUMMARY OF INVENTION

Technical Problem

However, in the example of the solid-state imaging device described in Patent Literature 1, in order to ensure the withstand voltage of the pixel circuit when applying a voltage to the p-type semiconductor region so that a voltage equal to or higher than the breakdown voltage is applied to the avalanche multiplication region, it is necessary to deplete a region between adjacent n-type semiconductor regions (separation region between pixels), and this is expected to be difficult in terms of feasibility.

It is an object of the present disclosure to provide a multiplying image sensor capable of ensuring the withstand voltage of a pixel circuit.

Solution to Problem

A multiplying image sensor according to an aspect of the present disclosure includes: a semiconductor layer having a first surface and a second surface on a side opposite to the first surface and including a plurality of pixels arranged along the first surface; and a wiring layer provided on the second surface. Each of the plurality of pixels includes: a first conductive type first semiconductor region; a second conductive type second semiconductor region formed on the second surface side with respect to at least a part of the first semiconductor region and divided for each of the plurality of pixels; and a first conductive type well region formed in the second semiconductor region so as to be separated from the first semiconductor region and forming a part of a pixel circuit. At least a part of the first semiconductor region and at least a part of the second semiconductor region form an avalanche multiplication region.

In the multiplying image sensor, in each of the plurality of pixels, the avalanche multiplication region is formed by at least a part of the first conductive type first semiconductor region and at least a part of the second conductive type second semiconductor region divided for each of the plurality of pixels, and the first conductive type well region forming a part of the pixel circuit is formed in the second conductive type second semiconductor region so as to be separated from the first conductive type first semiconductor region. As a result, when a voltage is applied to the first semiconductor region so that a voltage equal to or higher than the breakdown voltage is applied to the avalanche multiplication region, the pixel circuit is less likely to be affected by the voltage. Therefore, according to the multiplying image sensor, it is possible to ensure the withstand voltage of the pixel circuit.

In the multiplying image sensor according to the aspect of the present disclosure, the second semiconductor region may be divided for each of the plurality of pixels by a portion other than the part of the first semiconductor region. Therefore, it is possible to suppress the occurrence of crosstalk between adjacent pixels.

In the multiplying image sensor according to the aspect of the present disclosure, the second semiconductor region may be divided for each of the plurality of pixels by a trench formed in the semiconductor layer so as to open on the second surface side. Therefore, it is possible to suppress the occurrence of crosstalk between adjacent pixels.

In the multiplying image sensor according to the aspect of the present disclosure, the well region may be formed in the second semiconductor region so as to be separated from the trench. Therefore, it is possible to ensure the withstand voltage of the pixel circuit.

In the multiplying image sensor according to the aspect of the present disclosure, the well region may be formed in the second semiconductor region so as to be in contact with the trench. Therefore, it is possible to increase the arrangement density of a plurality of pixels, that is, to improve the aperture ratio as an image sensor.

In the multiplying image sensor according to the aspect of the present disclosure, the second semiconductor region may be electrically connected to the wiring layer in a central portion of the second semiconductor region when viewed from a direction perpendicular to the first surface. Therefore, the charge generated in each of a plurality of pixels can be transferred to the wiring layer in a well-balanced manner.

In the multiplying image sensor according to the aspect of the present disclosure, each of the plurality of pixels may include, as the well region, a plurality of well regions divided from each other in the second semiconductor region. Therefore, an independent voltage can be applied to the pixel circuit in each of the plurality of well regions.

Advantageous Effects of Invention

According to the present disclosure, it is possible to provide a multiplying image sensor capable of ensuring the withstand voltage of the pixel circuit.

DESCRIPTION OF EMBODIMENTS

Figure 1:
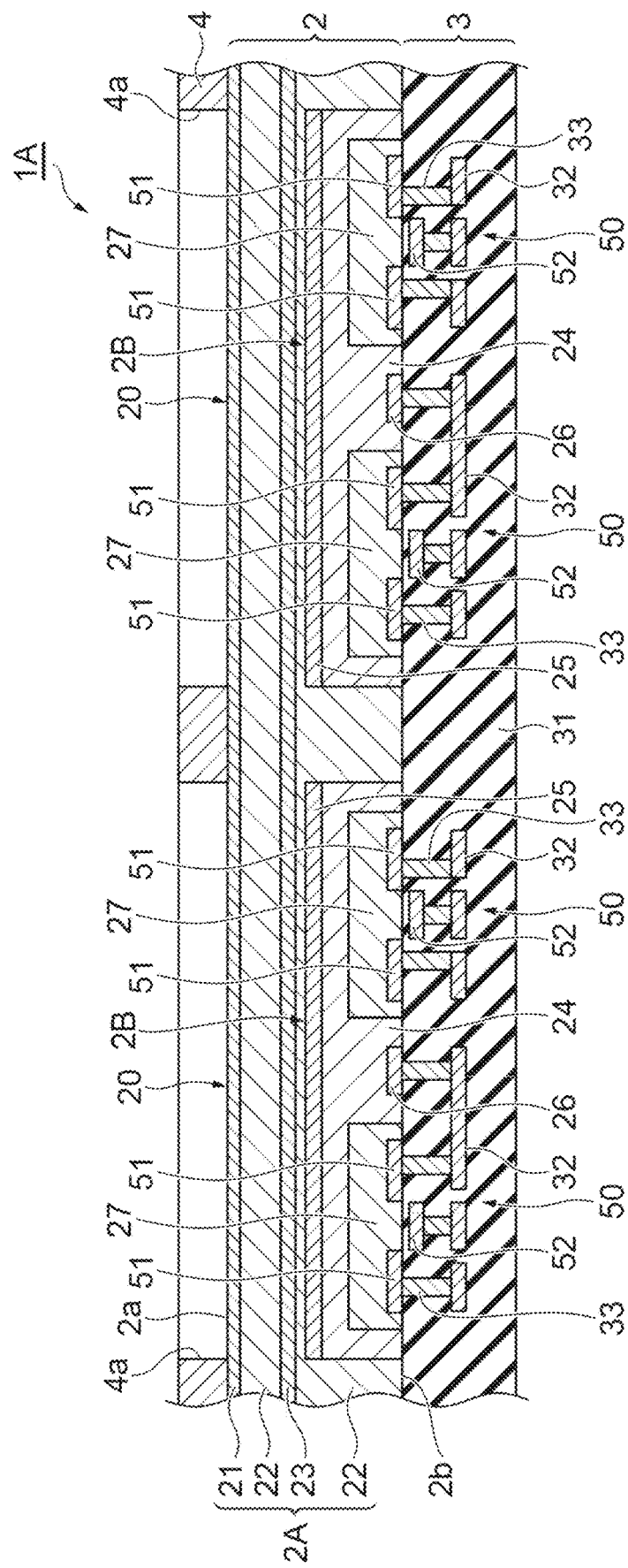
FIG. 1 is a cross-sectional view of a part of a multiplying image sensor according to a first embodiment.

Hereinafter, embodiments of the present disclosure will be described in detail with reference to the diagrams. In addition, the same or equivalent portions in the diagrams are denoted by the same reference numerals, and repeated description thereof will be omitted.

First Embodiment

Figure 2:
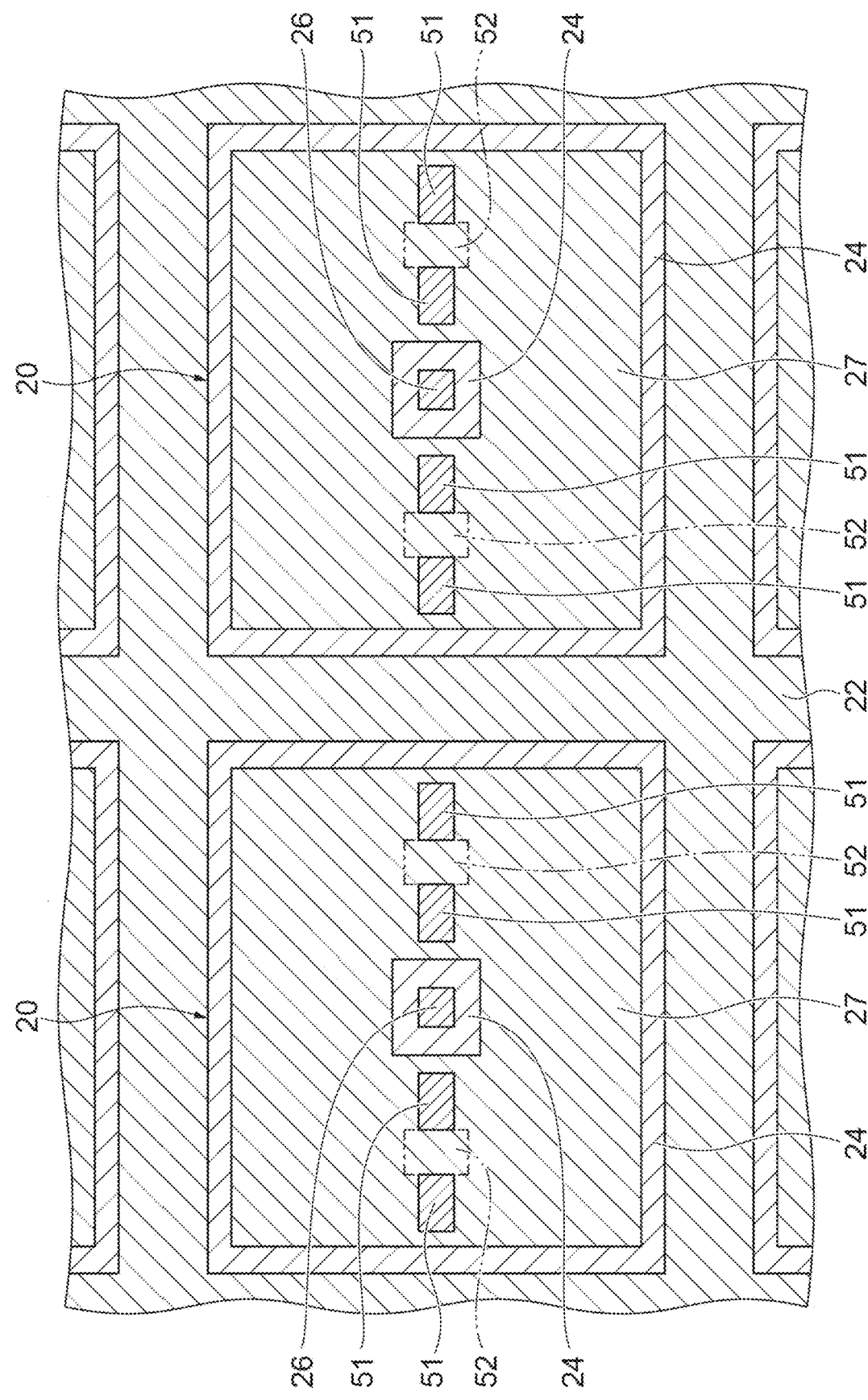
FIG. 2 is a bottom view of a part of a semiconductor layer of the multiplying image sensor shown in FIG. 1.

As shown in FIGS. 1 and 2, a multiplying image sensor 1A includes a semiconductor layer 2. The semiconductor layer 2 has a first surface 2a and a second surface 2b on a side opposite to the first surface 2a. The semiconductor layer 2 includes a plurality of pixels 20 arranged along the first surface 2a. The plurality of pixels 20 are arranged in a matrix, for example.

Each pixel 20 includes a first conductive type first semiconductor region 2A and a second conductive type second semiconductor region 2B. The first semiconductor region 2A includes a p$^+$-type semiconductor region 21, a p$^-$-type semiconductor region 22, and a p-type semiconductor region 23. The second semiconductor region 2B includes an n$^-$-type semiconductor region 24, an n-type semiconductor region 25, and an n-type semiconductor region 26.

The p$^+$-type semiconductor region 21 is a layered region along the first surface 2a, and is formed over a plurality of pixels 20 (that is, is continuous in the semiconductor layer 2). As an example, the impurity concentration of the p$^+$-type semiconductor region 21 is $1\times10^{18}$ cm$^{-3}$ or more, and the thickness of the p$^+$-type semiconductor region 21 is about 1.0 μm.

The p$^-$-type semiconductor region 22 is a region extending from the p$^+$-type semiconductor region 21 to the second surface 2b, and is formed over a plurality of pixels 20. As an example, the impurity concentration of the p$^-$-type semiconductor region 22 is $1\times10^{16}$ cm$^{-3}$ or less, and the thickness of the p$^-$-type semiconductor region 22 is about 10 μm.

The p-type semiconductor region 23 is a layered region extending approximately parallel to the first surface 2a in the p$^-$-type semiconductor region 22, and is formed over a plurality of pixels 20. As an example, the impurity concentration of the p-type semiconductor region 23 is $5\times10^{16}$ cm$^{-3}$ or more and $1\times10^{18}$ cm$^{-3}$ or less, and the thickness of the p-type semiconductor region 23 is about 1.0 μm.

The n$^-$-type semiconductor region 24 is a region reaching the second surface 2b in a portion of the p$^-$-type semiconductor region 22 located closer to the second surface 2b than the p-type semiconductor region 23, and is divided for each pixel 20. The impurity concentration of the n$^-$-type semiconductor region 24 is $1\times10^{16}$ cm$^{-3}$ or less, and the thickness of the n$^-$-type semiconductor region 24 is about 1.0 μm.

The n-type semiconductor region 25 is a layered region along the edge of the n$^-$-type semiconductor region 24 on the first surface 2a side, and is divided for each pixel 20. The impurity concentration of the n-type semiconductor region 25 is $5\times10^{16}$ cm$^{-3}$ or more and $1\times10^{18}$ cm$^{-3}$ or less, and the thickness of the n-type semiconductor region 25 is about 1.0 μm.

The n-type semiconductor region 26 is a region along the second surface 2b in the central portion of the n$^-$-type semiconductor region 24 when viewed from the direction perpendicular to the first surface 2a. The impurity concentration of the n-type semiconductor region 26 is $1\times10^{16}$ cm$^{-3}$ or more, and the thickness of the n-type semiconductor region 26 is about 0.5 μm.

In the semiconductor layer 2, the second semiconductor region 2B is formed on the second surface 2b side with respect to a part of the first semiconductor region 2A, and is divided for each pixel 20. The second semiconductor region 2B is divided for each pixel 20 by another part of the first semiconductor region 2A. Specifically, in the adjacent pixels 20, a part of the p$^-$-type semiconductor region 22 (a portion of the p$^-$-type semiconductor region 22 other than a portion overlapping the n-type semiconductor region 25 when viewed from the direction perpendicular to the first surface 2a) is arranged between the second semiconductor region 2B of one pixel 20 and the second semiconductor region 2B of the other pixel 20.

In each pixel 20, a photoelectric conversion region is formed by portions of the p$^-$-type semiconductor region 22 and the p-type semiconductor region 23 overlapping the n-type semiconductor region 25 when viewed from the direction perpendicular to the first surface 2a and the n-type semiconductor region 25. In addition, in each pixel 20, an avalanche multiplication region is formed by a portion of the p-type semiconductor region 23 overlapping the n-type semiconductor region 25 when viewed from the direction perpendicular to the first surface 2a, the n-type semiconductor region 25, and a portion of the p$^-$-type semiconductor region 22 between the portion of the p-type semiconductor region 23 and the n-type semiconductor region 25. That is, the avalanche multiplication region is formed by a part of the first semiconductor region 2A and a part of the second semiconductor region 2B. The avalanche multiplication region is a region having a function of multiplying the charge by the avalanche, and is a region where an electric field strength of $3\times10^5$ to $4\times10^5$ V/cm can be generated when a predetermined value of reverse bias is applied to the pn junction formed in the avalanche multiplication region.

Each pixel 20 includes a p-type well region 27 as a first conductive type well region. The p-type well region 27 is a region reaching the second surface 2b in the n$^-$-type semiconductor region 24, and is covered with the n$^-$-type semiconductor region 24 except for the second surface 2b side. That is, the p-type well region 27 is formed in the second semiconductor region 2B so as to be separated from the first semiconductor region 2A (that is, physically and electrically separated from the first semiconductor region 2A). In the present embodiment, the p-type well region 27 extends in a ring shape so as to surround the n-type semiconductor region 26 when viewed from the direction perpendicular to the first surface 2a.

The p-type well region 27 forms parts of the plurality of pixel circuits 50. Each pixel circuit 50 is an n-type MOSFET (metal-oxide-semiconductor field-effect transistor) including a pair of channel regions (a source region and a drain region) 51 formed in the p-type well region 27 and a gate electrode 52. Each pixel circuit 50 forms a transistor for reading out the signal charge flowing into the n⁻-type semiconductor region 24 through the n-type semiconductor region 26, a transistor for amplification, a transistor for resetting, and the like.

The semiconductor layer 2 configured as described above is manufactured as follows, for example. First, the p⁻-type semiconductor region 22 is formed on a substrate to be the p⁺-type semiconductor region 21 by using an epitaxial growth method. Then, the p-type semiconductor region 23 is formed in the p⁻-type semiconductor region 22 by using an ion implantation method. Then, a plurality of n⁻-type semiconductor regions 24 and a plurality of n-type semiconductor regions 25 are formed in the p⁻-type semiconductor region 22 by patterning using photolithography, an ion implantation method, and the like. Then, the n-type semiconductor region 26 and the p-type well region 27 are formed in each n⁻-type semiconductor region 24 by patterning using photolithography, an ion implantation method, and the like. Then, a plurality of channel regions 51 are formed in each p-type well region 27 by patterning using photolithography, an ion implantation method, and the like. Finally, the substrate is thinned by polishing to form the p⁺-type semiconductor region 21. In addition, the p⁻-type semiconductor region 22 and the p-type semiconductor region 23 may be formed on the substrate to be the p⁺-type semiconductor region 21 by using an epitaxial growth method.

The multiplying image sensor 1A further includes a wiring layer 3. The wiring layer 3 is provided on the second surface 2b of the semiconductor layer 2. The wiring layer 3 includes an insulating layer 31, a plurality of wirings 32, and a plurality of contact plugs 33. The plurality of wirings 32 and the plurality of contact plugs 33 are formed in the insulating layer 31. The n-type semiconductor region 26 is electrically connected to the corresponding wiring 32 through the contact plug 33. That is, the second semiconductor region 2B is electrically connected to the wiring layer 3 in the central portion of the second semiconductor region 2B when viewed from the direction perpendicular to the first surface 2a. Each portion of the pixel circuit 50 is electrically connected to the corresponding wiring 32 through the contact plug 33. Each wiring 32 is electrically connected to, for example, a CMOS read circuit portion of the multiplying image sensor 1A.

Figure 3:
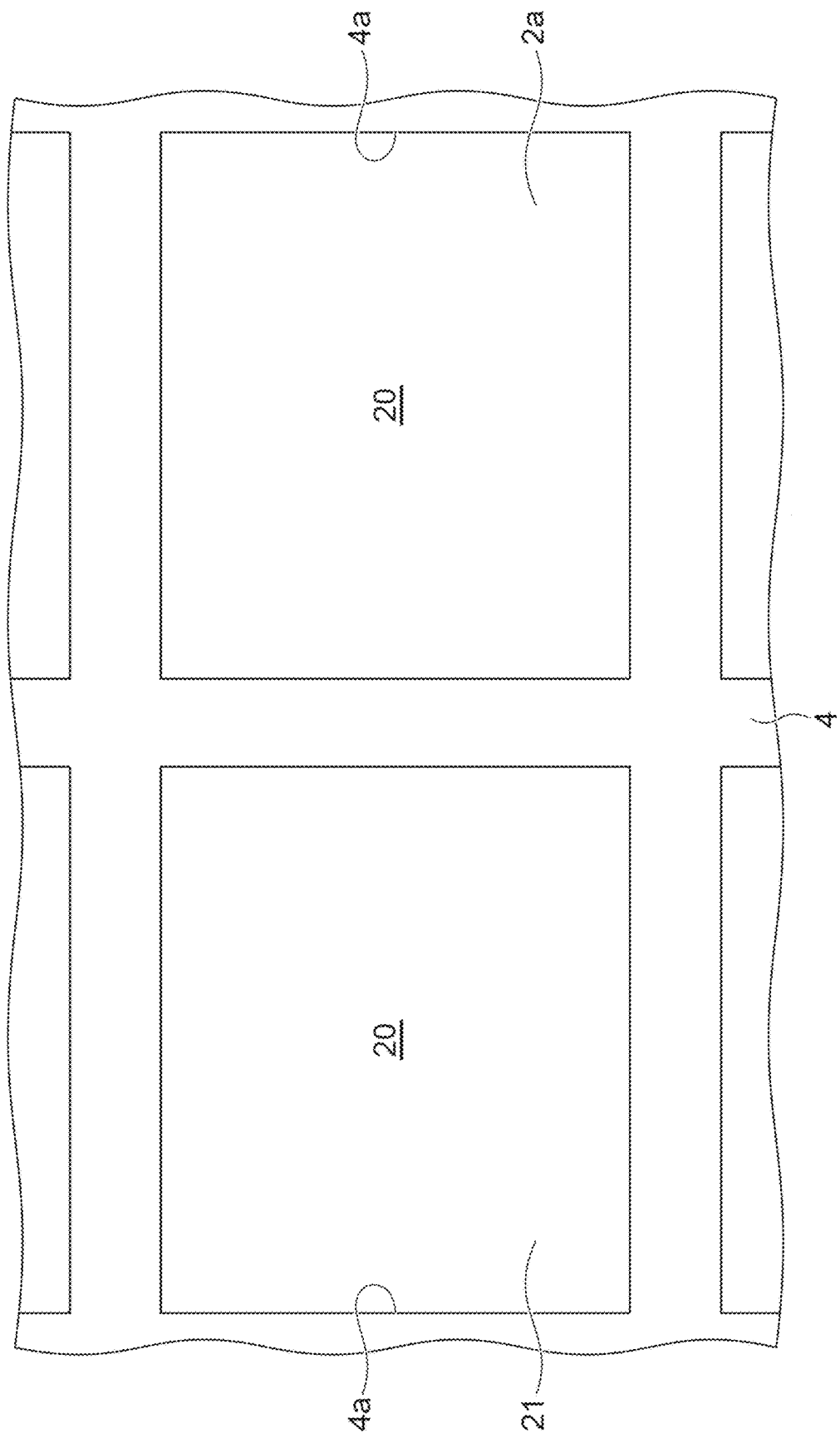
FIG. 3 is a plan view of a part of the multiplying image sensor shown in FIG. 1.

The multiplying image sensor 1A further includes an electrode layer 4. As shown in FIGS. 1 and 3, the electrode layer 4 is provided on the first surface 2a of the semiconductor layer 2. The electrode layer 4 is electrically connected to the p⁺-type semiconductor region 21. The electrode layer 4 includes a plurality of openings 4a. Each opening 4a overlaps the n-type semiconductor region 25 of each pixel 20 when viewed from the direction perpendicular to the first surface 2a. The electrode layer 4 is formed of metal, for example, and extends in a grid pattern so that a plurality of openings 4a are formed. Each opening 4a functions as a light incidence opening of each pixel 20.

The multiplying image sensor 1A configured as described above operates as follows. That is, when a voltage is applied to the p⁺-type semiconductor region 21 through the electrode layer 4 so that a predetermined value of reverse bias is applied to the pn junction formed in the avalanche multiplication region (that is, a voltage equal to or higher than the breakdown voltage is applied to the avalanche multiplication region), an electric field strength of $3 \times 10^5$ to $4 \times 10^5$ V/cm is generated in the avalanche multiplication region of each pixel 20. When light is incident on the photoelectric conversion region of each pixel 20 through each opening 4a of the electrode layer 4 in this state, in each pixel 20, the charge generated by light absorption is multiplied by the avalanche, and the multiplied signal charge flows into the n⁻-type semiconductor region 24 and is read out by the plurality of pixel circuits 50.

As described above, in the multiplying image sensor 1A, in each pixel 20, an avalanche multiplication region is formed by a part of the p-type first semiconductor region 2A and a part of the n-type second semiconductor region 2B divided for each pixel 20, and the p-type well region 27 that forms parts of the plurality of pixel circuits 50 are formed inside the n-type second semiconductor region 2B so as to be separated from the p-type first semiconductor region 2A. As a result, when a voltage is applied to the first semiconductor region 2A so that a voltage equal to or higher than the breakdown voltage is applied to the avalanche multiplication region, each pixel circuit 50 is less likely to be affected by the voltage. Therefore, according to the multiplying image sensor 1A, it is possible to ensure the withstand voltage of each pixel circuit 50.

In addition, in the multiplying image sensor 1A, the second semiconductor region 2B is divided for each pixel 20 by another part of the first semiconductor region 2A. Therefore, it is possible to suppress the occurrence of crosstalk between the adjacent pixels 20.

In addition, in the multiplying image sensor 1A, the second semiconductor region 2B is electrically connected to the wiring layer 3 in the central portion of the second semiconductor region 2B when viewed from the direction perpendicular to the first surface 2a. Therefore, the charge generated in each pixel 20 can be transferred to the wiring layer 3 in a well-balanced manner.

Second Embodiment

Figure 4:
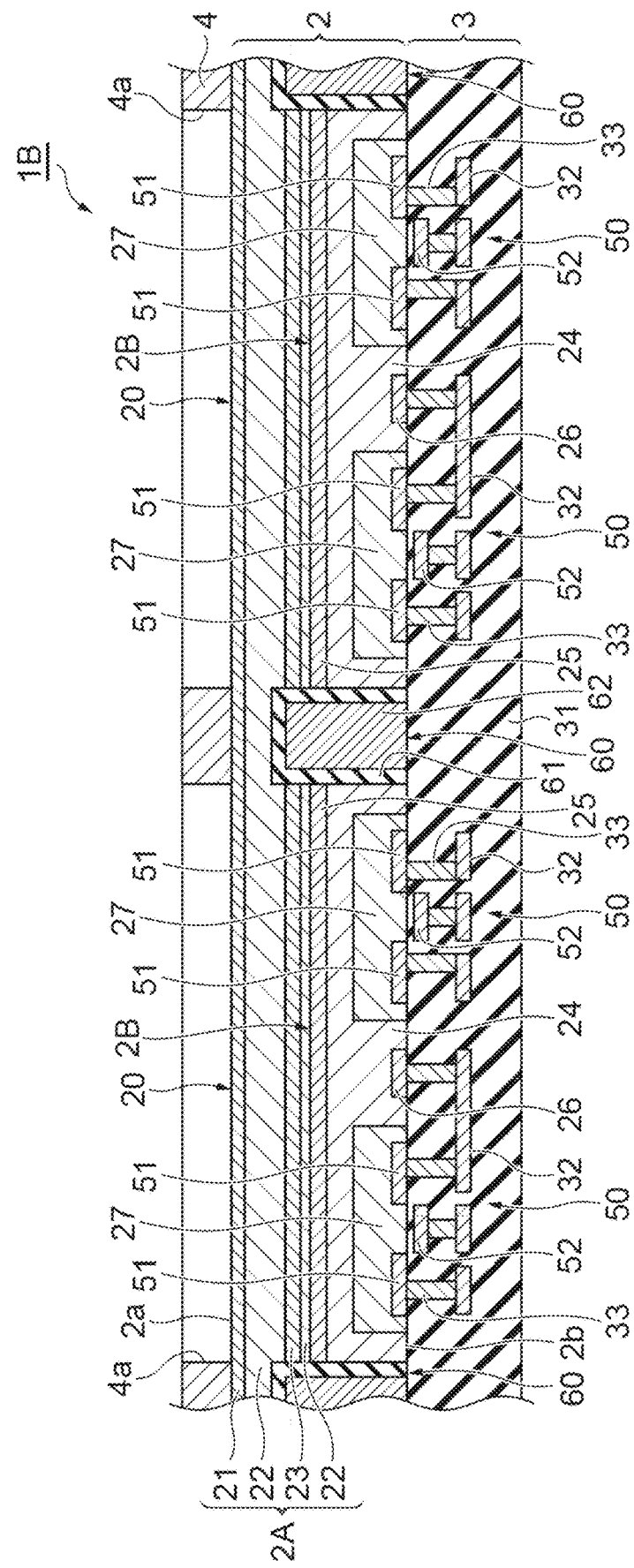
FIG. 4 is a cross-sectional view of a part of a multiplying image sensor according to a second embodiment.
Figure 5:
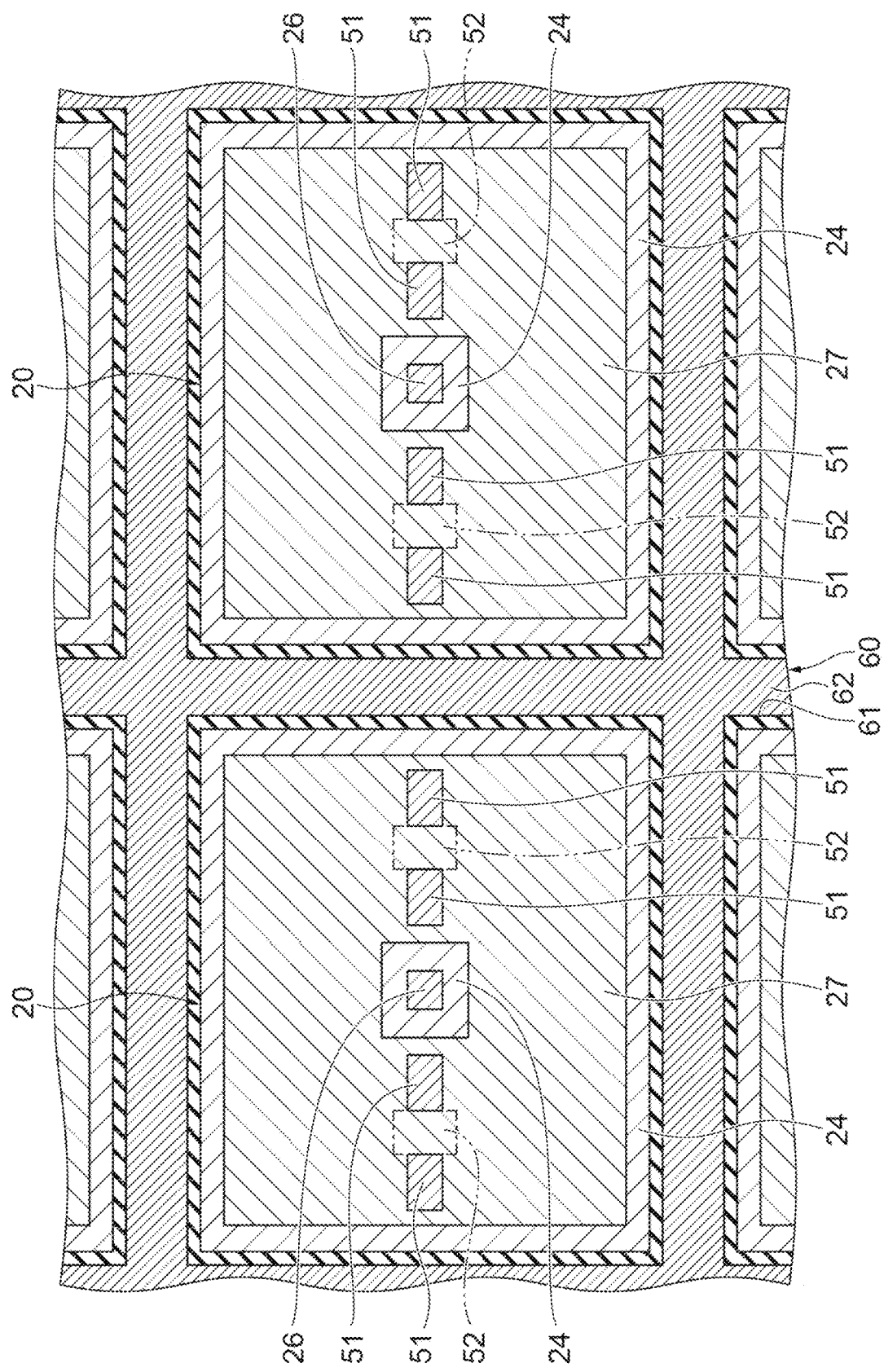
FIG. 5 is a bottom view of a part of a semiconductor layer of the multiplying image sensor shown in FIG. 4.

As shown in FIGS. 4 and 5, a multiplying image sensor 1B differs from the above-described multiplying image sensor 1A in that the second semiconductor region 2B is divided for each pixel 20 by a trench 60. In the multiplying image sensor 1B, the trench 60 is formed in the semiconductor layer 2 so as to open on the second surface 2b side. The trench 60 extends, for example, in a grid pattern so as to pass between the adjacent pixels 20 when viewed from the direction perpendicular to the first surface 2a. The trench 60 includes an insulating film 61 formed along the inner surface and a metal member 62 arranged inside. In addition, instead of the metal member 62, an insulating member or the like may be arranged in the trench 60.

In the multiplying image sensor 1B, the bottom surface of the trench 60 is located closer to the first surface 2a than the p-type semiconductor region 23. Therefore, the second semiconductor region 2B (specifically, the n⁻-type semiconductor region 24 and the n-type semiconductor region 25) is divided for each pixel 20. The position of the bottom surface of the trench 60 may be at least a position where the second semiconductor region 2B is divided for each pixel 20, and may not reach the p-type semiconductor region 23, for example. The p-type well region 27 is formed in the second semiconductor region 2B (specifically, in the n⁻-type semiconductor region 24) so as to be separated from the trench 60. The p-type well region 27 is covered with the n⁻-type semiconductor region 24 except for the second surface 2b side.

In the multiplying image sensor 1B, similarly to the multiplying image sensor 1A described above, in each pixel 20, an avalanche multiplication region is formed by a part of the p-type first semiconductor region 2A and a part of the n-type second semiconductor region 2B divided for each pixel 20, and the p-type well region 27 that forms parts of the plurality of pixel circuits 50 are formed inside the n-type second semiconductor region 2B so as to be separated from the p-type first semiconductor region 2A. As a result, when a voltage is applied to the first semiconductor region 2A so that a voltage equal to or higher than the breakdown voltage is applied to the avalanche multiplication region, each pixel circuit 50 is less likely to be affected by the voltage. Therefore, according to the multiplying image sensor 1B, it is possible to ensure the withstand voltage of each pixel circuit 50.

In addition, in the multiplying image sensor 1B, the second semiconductor region 2B is divided for each pixel 20 by the trench 60 formed in the semiconductor layer 2 so as to open on the second surface 2b side. Therefore, it is possible to suppress the occurrence of crosstalk between the adjacent pixels 20.

In addition, in the multiplying image sensor 1B, the p-type well region 27 is formed in the second semiconductor region 2B so as to be separated from the trench 60. Therefore, it is possible to ensure the withstand voltage of the plurality of pixel circuits 50.

Third Embodiment

Figure 6:
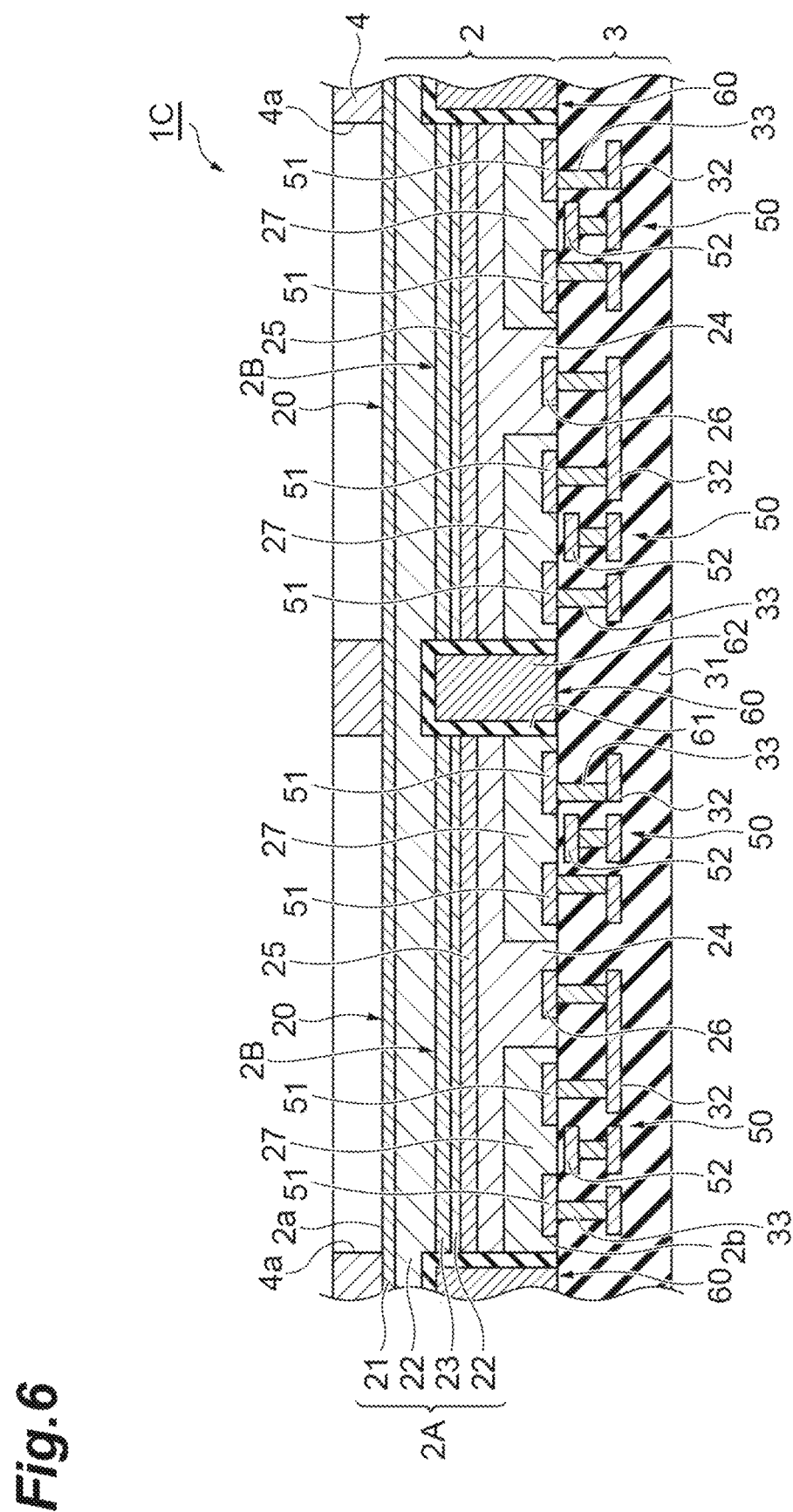
FIG. 6 is a cross-sectional view of a part of a multiplying image sensor according to a third embodiment.
Figure 7:
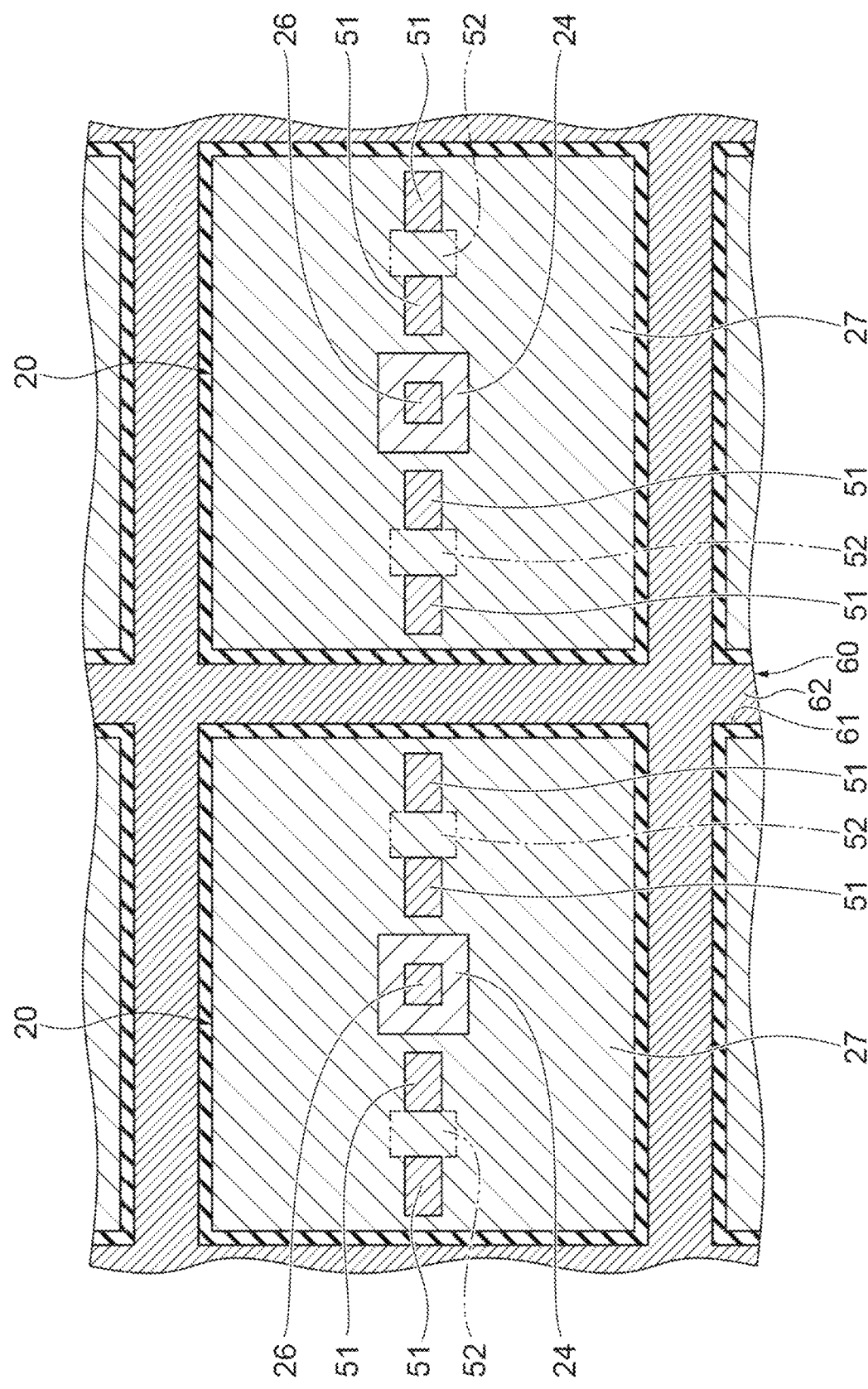
FIG. 7 is a bottom view of a part of a semiconductor layer of the multiplying image sensor shown in FIG. 6.

As shown in FIGS. 6 and 7, a multiplying image sensor 1C is different from the above-described multiplying image sensor 1B in that the p-type well region 27 is formed in the second semiconductor region 2B so as to be in contact with the trench 60. In the multiplying image sensor 1C, the p-type well region 27 is formed in the n⁻-type semiconductor region 24 so as to be in contact with the trench 60. The p-type well region 27 is covered with the n⁻-type semiconductor region 24 and the trench 60 except for the second surface 2b side.

In the multiplying image sensor 1C, similarly to the multiplying image sensor 1A described above, in each pixel 20, an avalanche multiplication region is formed by a part of the p-type first semiconductor region 2A and a part of the n-type second semiconductor region 2B divided for each pixel 20, and the p-type well region 27 that forms parts of the plurality of pixel circuits 50 are formed inside the n-type second semiconductor region 2B so as to be separated from the p-type first semiconductor region 2A. As a result, when a voltage is applied to the first semiconductor region 2A so that a voltage equal to or higher than the breakdown voltage is applied to the avalanche multiplication region, each pixel circuit 50 is less likely to be affected by the voltage. Therefore, according to the multiplying image sensor 1C, it is possible to ensure the withstand voltage of each pixel circuit 50.

In addition, in the multiplying image sensor 1C, similarly to the multiplying image sensor 1B described above, the second semiconductor region 2B is divided for each pixel 20 by the trench 60 formed in the semiconductor layer 2 so as to open on the second surface 2b side. Therefore, it is possible to suppress the occurrence of crosstalk between the adjacent pixels 20.

In addition, in the multiplying image sensor 1C, the p-type well region 27 is formed in the second semiconductor region 2B so as to be in contact with the trench 60. Therefore, it is possible to increase the arrangement density of the plurality of pixels 20, that is, to improve the aperture ratio as an image sensor.

Modification Examples

Figure 8:
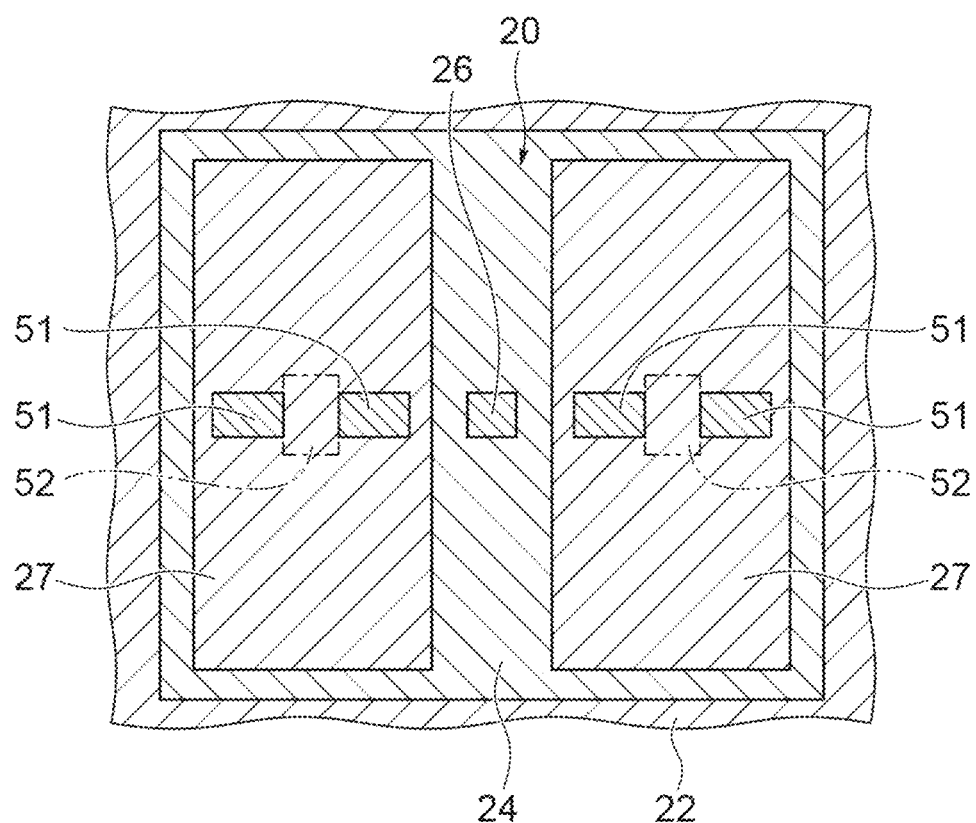
FIG. 8 is a bottom view of a part of a semiconductor layer of a multiplying image sensor of a first modification example.

The present disclosure is not limited to the first to third embodiments described above. For example, as shown in FIG. 8, each pixel 20 may include a plurality of p-type well regions 27 divided from each other in the second semiconductor region 2B. In the example shown in FIG. 8, a plurality of p-type well regions 27 are formed in the n⁻-type semiconductor region 24, and each p-type well region 27 forms the pixel circuit 50. Therefore, an independent voltage can be applied to the pixel circuit 50 in each p-type well region 27.

Figure 9:
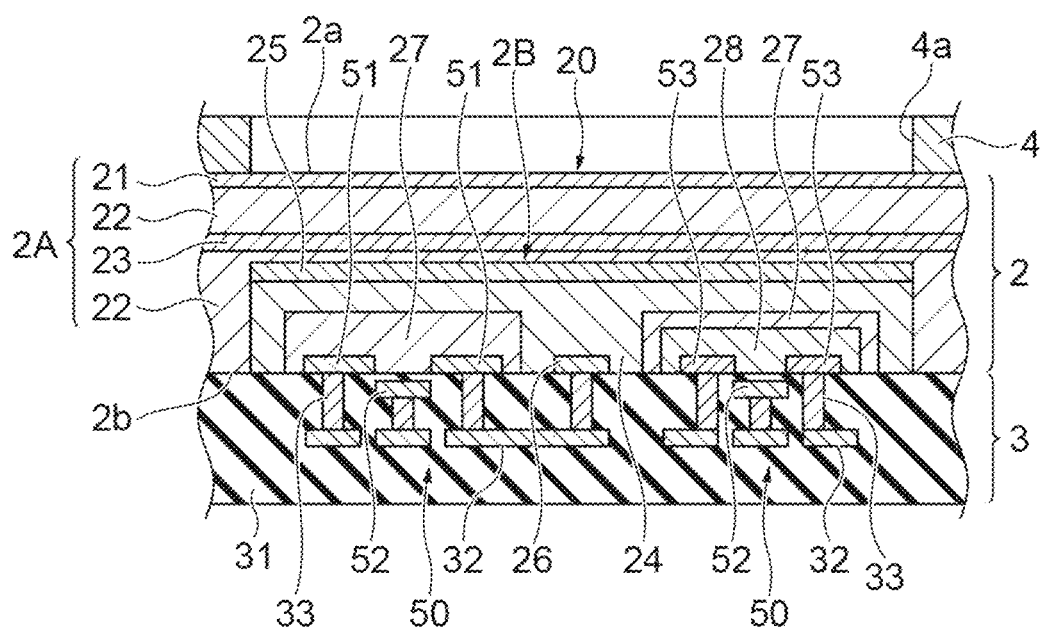
FIG. 9 is a cross-sectional view of a part of a multiplying image sensor of a second modification example.
Figure 10:
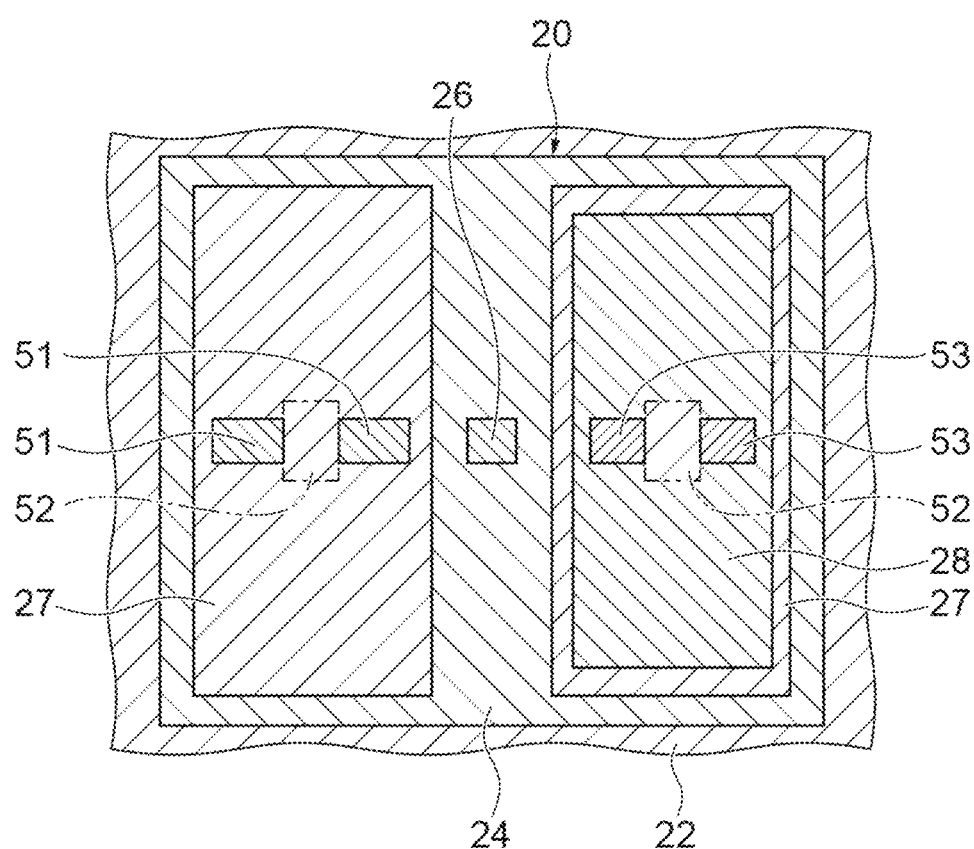
FIG. 10 is a bottom view of a part of a semiconductor layer of the multiplying image sensor shown in FIG. 9.

In addition, as shown in FIGS. 9 and 10, the p-type well region 27 may form a part of the pixel circuit 50 by forming an n-type well region 28 in the p-type well region 27. In the example shown in FIGS. 9 and 10, one pixel circuit 50 is an n-type MOSFET including a pair of channel regions (a source region and a drain region) 51 formed in the p-type well region 27 and the gate electrode 52, and the other pixel circuit 50 is a p-type MOSFET including a pair of channel regions (a source region and a drain region) 53 formed in the n-type well region 28 and the gate electrode 52.

Figure 11:
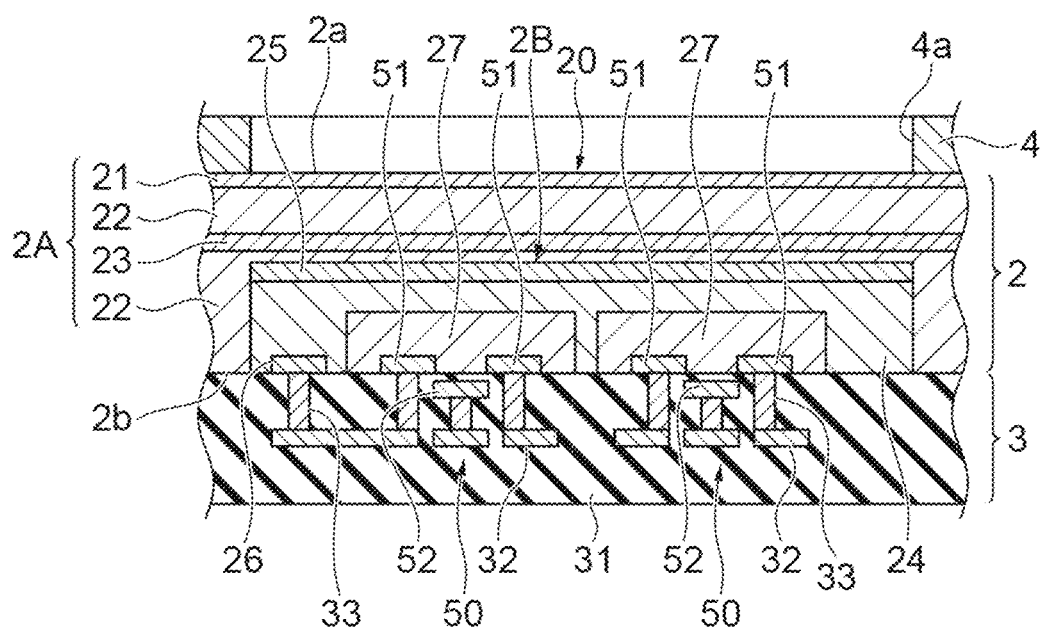
FIG. 11 is a cross-sectional view of a part of a multiplying image sensor of a third modification example.
Figure 12:
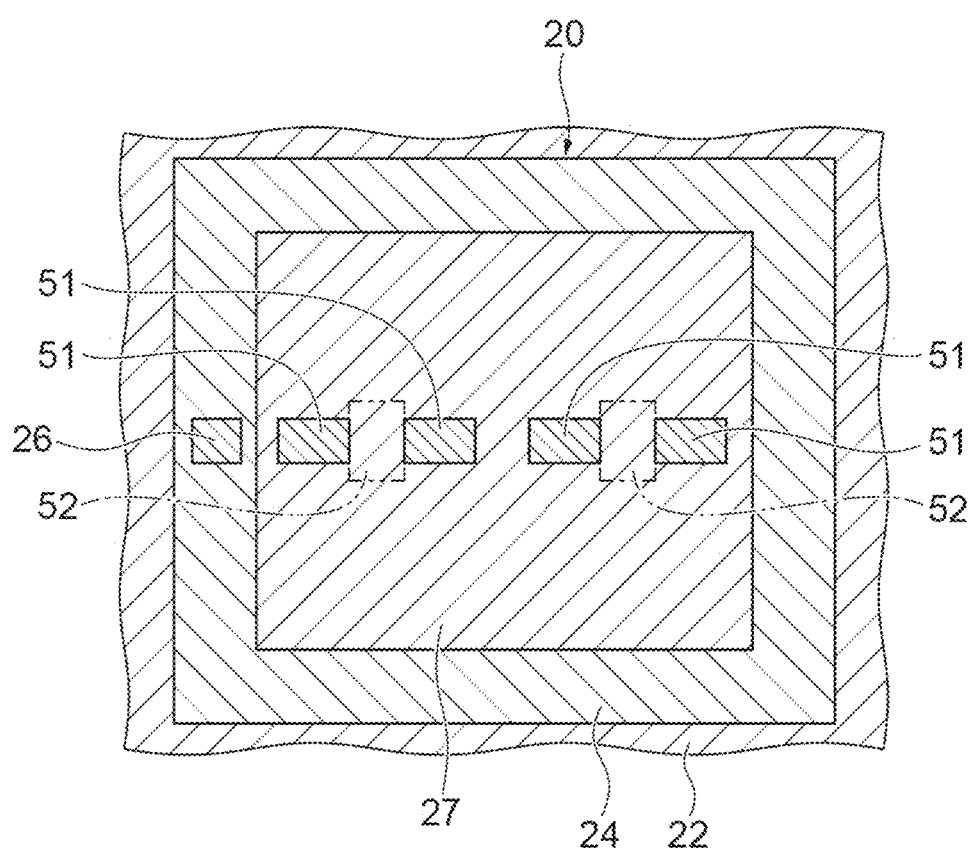
FIG. 12 is a bottom view of a part of a semiconductor layer of the multiplying image sensor shown in FIG. 11.

In addition, as shown in FIGS. 11 and 12, in each pixel 20, the second semiconductor region 2B may be electrically connected to the wiring layer 3 at the edge of the second semiconductor region 2B when viewed from the direction perpendicular to the first surface 2a. In the example shown in FIGS. 11 and 12, when viewed from the direction perpendicular to the first surface 2a, the p-type well region 27 formed in the n⁻-type semiconductor region 24 does not have a hole, and the n-type semiconductor region 26 is located at the edge of the n⁻-type semiconductor region 24.

In addition, the electrode layer 4 may be formed in a frame shape on the p⁺-type semiconductor region 21 so as to surround the plurality of pixels 20. In addition, the electrode layer 4 may be formed in a layered shape on the p⁺-type semiconductor region 21 by using a material having conductivity and light transmission (for example, ITO). In addition, instead of the electrode layer 4, a voltage may be applied to the first semiconductor region 2A through the metal member 62 in the trench 60 or a through electrode extending from the second surface 2b of the semiconductor layer 2 to the first surface 2a side.

In addition, the n-type semiconductor region 25 may not be formed in the semiconductor layer 2, and in each pixel 20, the avalanche multiplication region may be formed by a portion of the p-type semiconductor region 23 overlapping the n⁻-type semiconductor region 24 when viewed from the direction perpendicular to the first surface 2a, an edge of the n⁻-type semiconductor region 24 on the first surface 2a side, and a portion of the p⁻-type semiconductor region 22 between the portion of the p-type semiconductor region 23 and the edge. In addition, the pixel circuit 50 is not limited to the MOSFET, and may be a JFET (junction field-effect transistor), a bipolar transistor, and the like. In addition, the conductive types of p-type and n-type may be reversed from those described above. That is, the first conductive type may be n-type and the second conductive type may be p-type. In addition, the plurality of pixels 20 may be arranged one-dimensionally along the first surface 2a of the semiconductor layer 2.

REFERENCE SIGNS LIST 1A, 1B, 1C: multiplying image sensor, 2: semiconductor layer, 2a: first surface, 2b: second surface, 2A: first semiconductor region, 2B: second semiconductor region, 3: wiring layer, 20: pixel, 27: p-type well region (well region), 50: pixel circuit, 60: trench.

The invention claimed is:
1. A multiplying image sensor, comprising:
a semiconductor layer having a first surface and a second surface on a side opposite to the first surface and including a plurality of pixels arranged along the first surface; and
a wiring layer provided on the second surface,
wherein each of the plurality of pixels includes:
a first conductive type first semiconductor region;
a second conductive type second semiconductor region formed on the second surface side with respect to at least a part of the first semiconductor region and divided for each of the plurality of pixels; and
a first conductive type well region formed in the second semiconductor region so as to be separated from the first semiconductor region and forming a part of a pixel circuit,
at least a part of the first semiconductor region and at least a part of the second semiconductor region form an avalanche multiplication region, and
a part of the second semiconductor region where the well region is formed is continuous with a part of the second semiconductor region forming the avalanche multiplication region.

2. The multiplying image sensor according to claim 1, wherein the second semiconductor region is divided for each of the plurality of pixels by a portion other than the part of the first semiconductor region.

3. The multiplying image sensor according to claim 1, wherein the second semiconductor region is divided for each of the plurality of pixels by a trench formed in the semiconductor layer so as to open on the second surface side.

4. The multiplying image sensor according to claim 3, wherein the well region is formed in the second semiconductor region so as to be separated from the trench.

5. The multiplying image sensor according to claim 3, wherein the well region is formed in the second semiconductor region so as to be in contact with the trench.

6. The multiplying image sensor according to claim 1, wherein the second semiconductor region is electrically connected to the wiring layer in a central portion of the second semiconductor region when viewed from a direction perpendicular to the first surface.

7. The multiplying image sensor according to claim 1, wherein each of the plurality of pixels includes, as the well region, a plurality of well regions divided from each other in the second semiconductor region.

8. The multiplying image sensor according to claim 1, wherein the well region overlaps with the avalanche multiplication region when viewed from a direction perpendicular to the first surface.

* * * * *